(12) United States Patent
Perzlmaier et al.

(10) Patent No.: US 10,217,903 B2
(45) Date of Patent: Feb. 26, 2019

(54) OPTOELECTRONIC SEMICONDUCTOR CHIP AND OPTOELECTRONIC MODULE

(71) Applicant: OSRAM Opto Semiconductors GmbH, Regensburg (DE)

(72) Inventors: Korbinian Perzlmaier, Regensburg (DE); Christian Leirer, Friedberg (DE)

(73) Assignee: OSRAM Opto Semiconductors GmbH (DE)

( * ) Notice: Subject to any disclaimer, the term of this patent is extended or adjusted under 35 U.S.C. 154(b) by 0 days.

(21) Appl. No.: 15/571,624

(22) PCT Filed: May 12, 2016

(86) PCT No.: PCT/EP2016/060744
§ 371 (c)(1),
(2) Date: Nov. 3, 2017

(87) PCT Pub. No.: WO2016/180939
PCT Pub. Date: Nov. 17, 2016

(65) Prior Publication Data
US 2018/0145225 A1 May 24, 2018

(30) Foreign Application Priority Data
May 13, 2015 (DE) .......................... 10 2015 107 526

(51) Int. Cl.
*H01L 33/38* (2010.01)
*H01L 25/075* (2006.01)
(Continued)

(52) U.S. Cl.
CPC ............ *H01L 33/382* (2013.01); *H01L 24/30* (2013.01); *H01L 25/0753* (2013.01); *H01L 33/486* (2013.01); *H01L 33/62* (2013.01)

(58) Field of Classification Search
CPC ...... H01L 33/382; H01L 33/486; H01L 33/62; H01L 24/30; H01L 25/0753
See application file for complete search history.

(56) References Cited

U.S. PATENT DOCUMENTS

| 2012/0181568 A1 | 7/2012 | Hsia et al. |
| 2013/0207156 A1 | 8/2013 | Moosburger et al. |

(Continued)

FOREIGN PATENT DOCUMENTS

| DE | 10 2008 051 050 A1 | 4/2010 |
| DE | 10 2010 034 665 A1 | 2/2012 |

(Continued)

*Primary Examiner* — Phuc Dang
(74) *Attorney, Agent, or Firm* — DLA Piper LLP (US)

(57) ABSTRACT

An optoelectronic semiconductor chip includes a carrier and a semiconductor body arranged on the carrier with a semiconductor layer sequence, wherein the semiconductor layer sequence includes an active region arranged between a first semiconductor layer and a second semiconductor layer and generates or receives electromagnetic radiation, the first semiconductor layer connects to a first contact in an electrically-conductive manner, the first contact is formed on a rear side of the carrier facing away from the semiconductor body, the second semiconductor layer connects to both a second contact and a third contact in an electrically-conductive manner, and the second contact is formed on the front side of the carrier facing towards the semiconductor body and the third contact on the rear side of the carrier facing away from the semiconductor body.

16 Claims, 11 Drawing Sheets

(51) Int. Cl.
*H01L 33/48* (2010.01)
*H01L 33/62* (2010.01)
*H01L 23/00* (2006.01)

(56) References Cited

U.S. PATENT DOCUMENTS

| | | |
|---|---|---|
| 2013/0256735 A1 | 10/2013 | Kim |
| 2013/0307004 A1* | 11/2013 | Weidner .................. H01L 33/60 257/98 |
| 2014/0054635 A1* | 2/2014 | Herrmann ............. H01L 33/382 257/98 |
| 2014/0264266 A1 | 9/2014 | Li et al. |
| 2015/0144870 A1 | 5/2015 | An |
| 2015/0236206 A1* | 8/2015 | Gaertner .................. H01L 33/38 257/98 |
| 2015/0325598 A1 | 11/2015 | Pfeuffer et al. |
| 2016/0141286 A1* | 5/2016 | Holz .................... H01L 25/167 257/88 |

FOREIGN PATENT DOCUMENTS

| | | |
|---|---|---|
| DE | 10 2012 112 302 A1 | 6/2014 |
| EP | 2 453 492 A2 | 5/2012 |
| JP | 2007-287849 A | 11/2007 |
| WO | 2014/017871 A2 | 1/2014 |

* cited by examiner

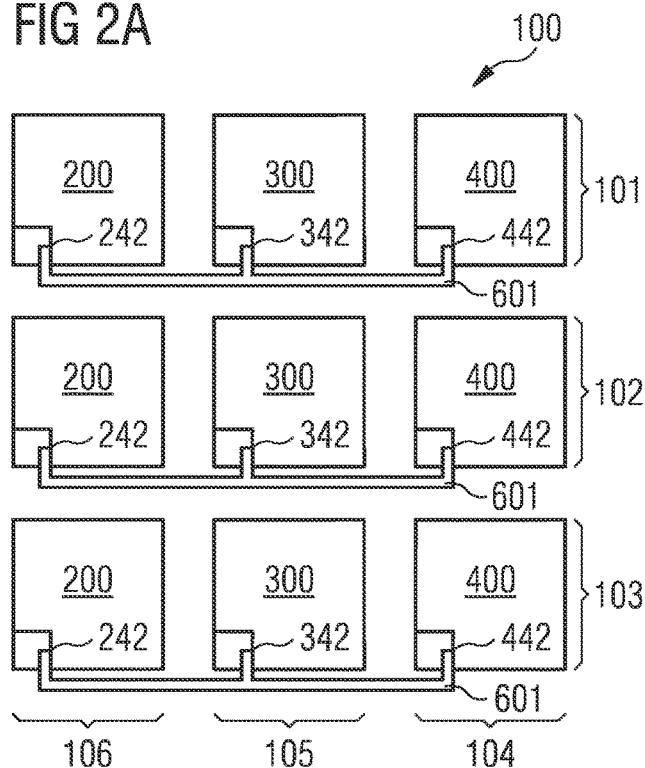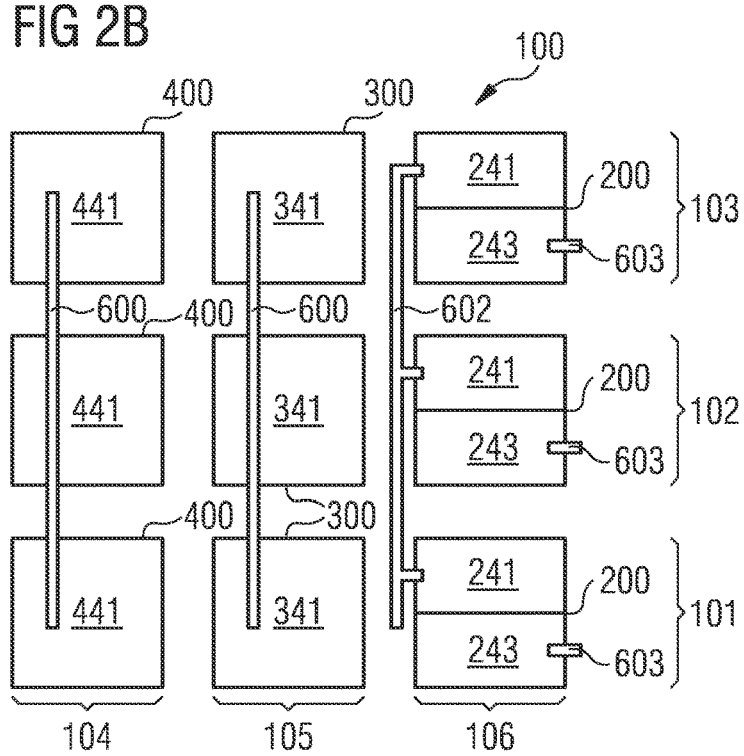

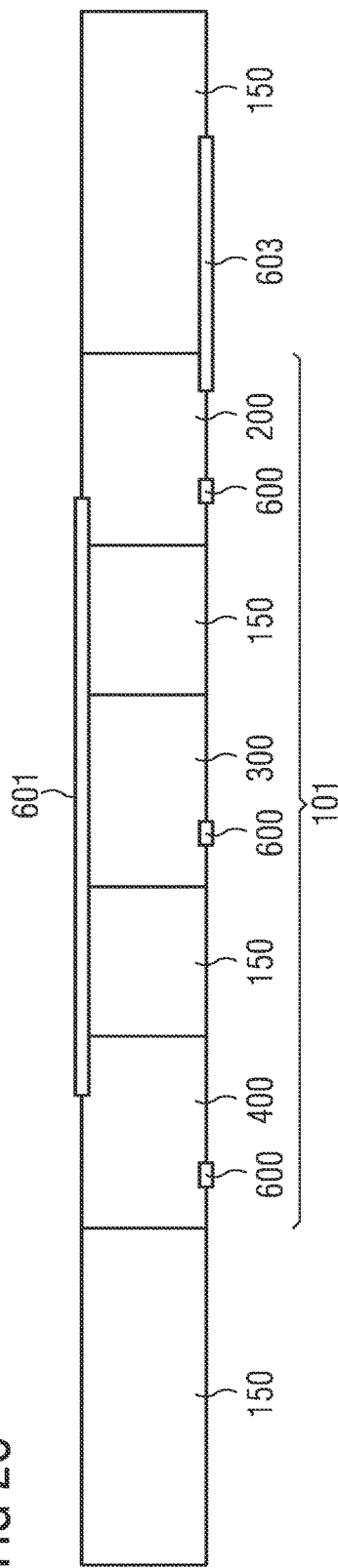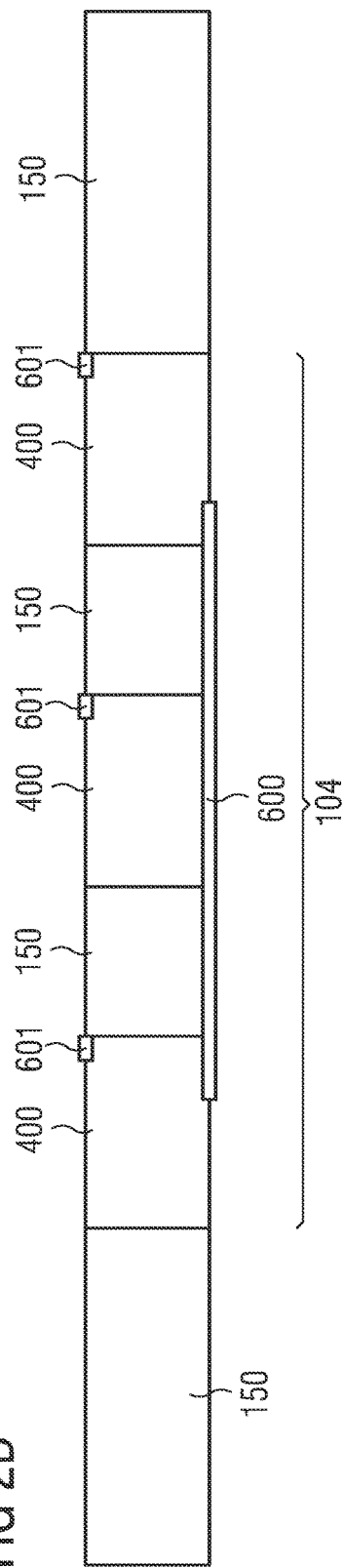

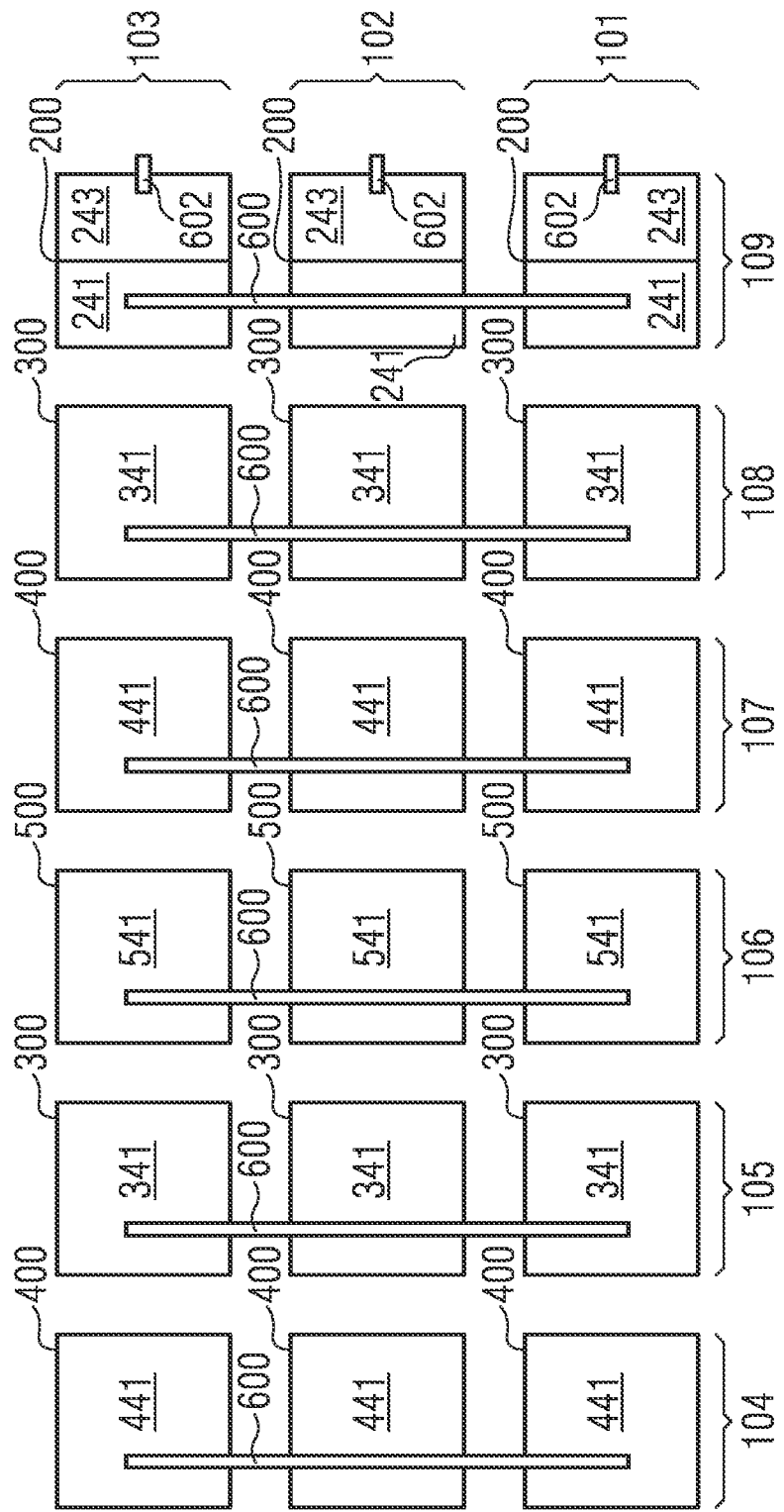

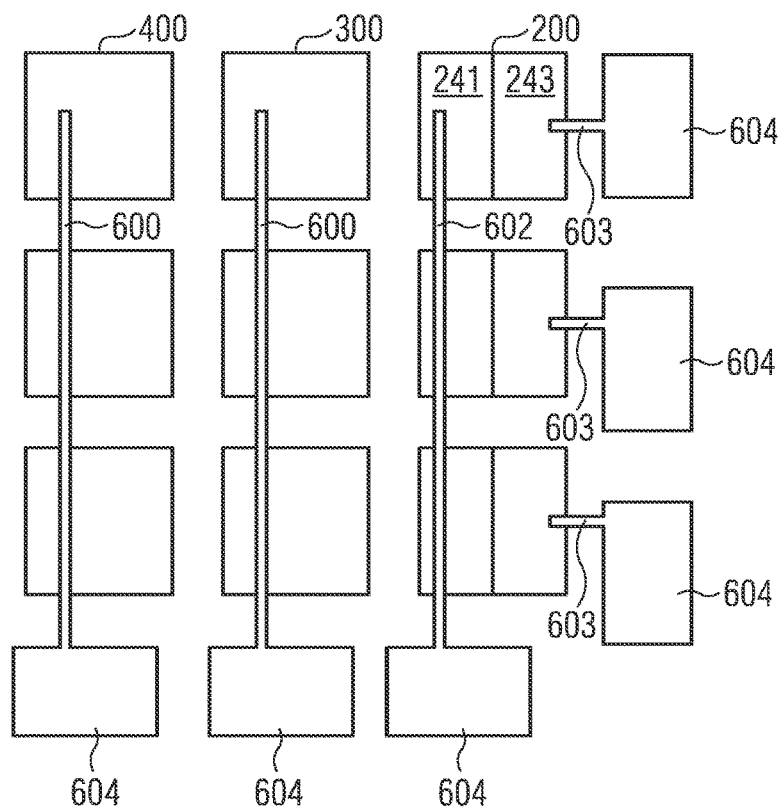
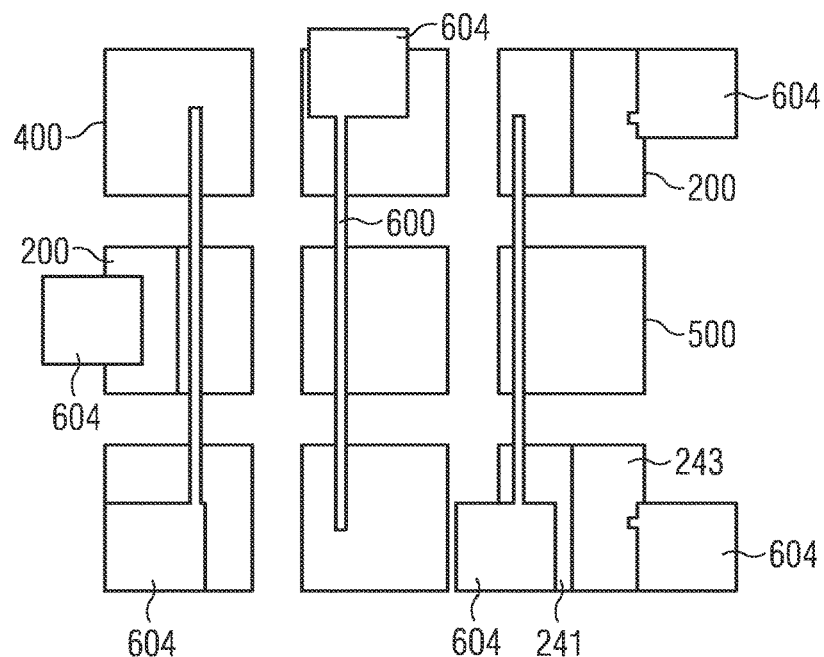

OPTOELECTRONIC SEMICONDUCTOR CHIP AND OPTOELECTRONIC MODULE

TECHNICAL FIELD

This application relates to an optoelectronic semiconductor chip and an optoelectronic module.

BACKGROUND

Optoelectronic semiconductor chips such as light-emitting diode semiconductor chips, e.g. LEDs, can be combined into larger functional units. One possible use is the grouping of units composed of multiple optoelectronic semiconductor chips having different color characteristics, e.g. red, green and blue (RGB). These RGB units can be used in a matrix configuration in displays or video screens. The individual semiconductor chips are operated in lines and columns with a high repetition rate. It can be advantageous in terms of resolution for individual units to be put together without a large distance between them, or seamlessly, to be able to generate a homogeneous image.

Most LEDs, for example, have at least one contact on their front side, i.e. the side at which light is emitted. A contacting of the chips to one another therefore generally takes place via the front side of the individual optoelectronic semiconductor chips and is generally associated with absorption of light by the material of the contacting.

It could be helpful to provide an optoelectronic semiconductor chip and an optoelectronic module that allow space-saving contacting.

SUMMARY

We provide an optoelectronic semiconductor chip including a carrier and a semiconductor body arranged on the carrier with a semiconductor layer sequence, wherein the semiconductor layer sequence includes an active region arranged between a first semiconductor layer and a second semiconductor layer and generates or receives electromagnetic radiation, the first semiconductor layer connects to a first contact in an electrically-conductive manner, the first contact is formed on a rear side of the carrier facing away from the semiconductor body, the second semiconductor layer connects to both a second contact and a third contact in an electrically-conductive manner, and the second contact is formed on the front side of the carrier facing towards the semiconductor body and the third contact on the rear side of the carrier facing away from the semiconductor body.

We also provide an optoelectronic module including at least one first semiconductor chip, wherein the first contact thereof forms a first rear contact, the second contact thereof forms a first front contact and the third contact thereof forms a second rear contact, at least one second semiconductor chip that generates or receives radiation and includes at least one first front contact and at least one first rear contact, wherein the first semiconductor chip and the second semiconductor chip mechanically connect by a module carrier, and the first rear contacts of the first semiconductor chip and of the second semiconductor chip and/or the first front contacts of the first semiconductor chip and of the second semiconductor chips connect to one another in an electrically-conductive manner.

We further provide an optoelectronic module including at least one first semiconductor chip including a carrier and a semiconductor body arranged on the carrier, wherein the semiconductor layer sequence includes an active region arranged between a first semiconductor layer and a second semiconductor layer and generates or receives electromagnetic radiation, wherein the first semiconductor layer connects to a first contact in an electrically-conductive manner, the first contact being formed on a rear side of the carrier facing away from the semiconductor body, wherein the second semiconductor layer connects to both a second contact and a third contact in an electrically-conductive manner, the second contact being formed on the front side of the carrier facing towards the semiconductor body and the third contact on the rear side of the carrier facing away from the semiconductor body, and at least one second semiconductor chip that generates or receives radiation and includes at least one first front contact and at least one first rear contact, wherein the first semiconductor chip and the second semiconductor chip mechanically connect by a module carrier, the first front contacts of the first semiconductor chip and of the second semiconductor chip connect to one another in an electrically-conductive manner, and an electrical activation of the optoelectronic module takes place by the second rear side contact of the at least one first semiconductor chip.

BRIEF DESCRIPTION OF THE DRAWINGS

FIGS. 2A, 2B, 2C and 2D show an example of an optoelectronic module in a 3×3 matrix arrangement.

FIGS. 3A, 3B, 3C and 3D show an example of an optoelectronic module in a 3×6 matrix arrangement.

FIGS. 5A, 5B, 5C and 5D show examples of a bond-pad interconnection of an optoelectronic module.

LIST OF REFERENCE NUMBERS

Figure 1A:
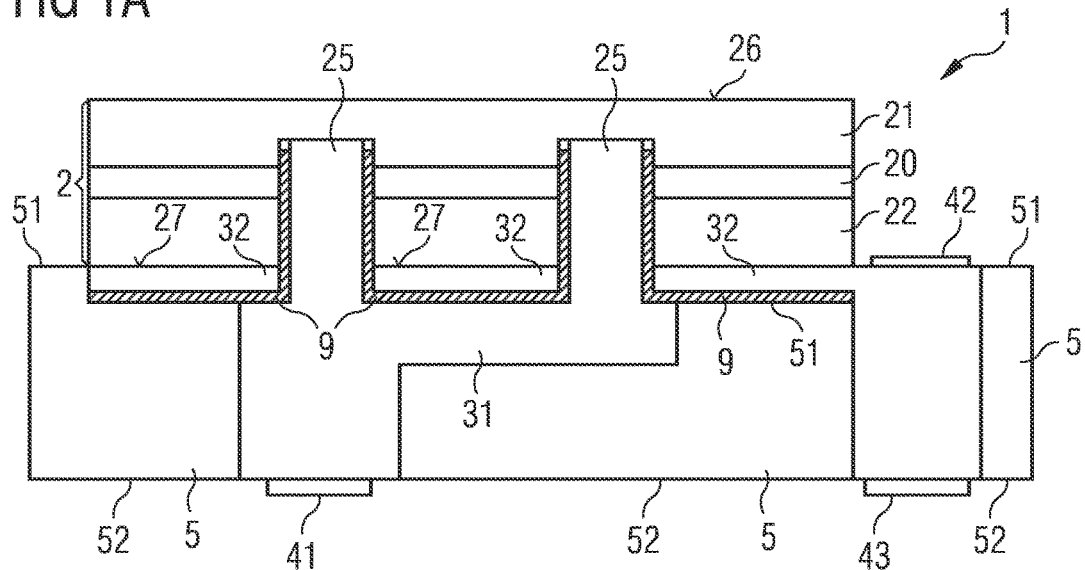
FIGS. 1A, 1B, 1C and 1D each show examples of an optoelectronic semiconductor chip in a cross-sectional diagram.

1 Optoelectronic semiconductor chip
2 Semiconductor body
5 Carrier
6 Joining layer
7 Insulation layer
20 Active region
21 Semiconductor layer
22 Semiconductor layer
25 Recess
26 Radiation passage surface
27 Main surface
28 Further connection layer
31 First connection layer
32 Second connection layer
41 Contact
42 Contact
43 Contact
51 Front side of the carrier
52 Rear side of the carrier
100 Optoelectronic module
101 Row
102 Row
103 Row
104 Column
105 Column
106 Column
107 Column
108 Column 109 Column
200 Semiconductor chip
201 Semiconductor chip
241 Contact
242 Contact
243 Contact
300 Semiconductor chip
341 Contact
342 Contact
343 Contact
400 Semiconductor chip
441 Contact
442 Contact
443 Contact
500 Semiconductor chip
541 Contact
542 Contact
543 Contact
600 Metal layer
601 Metal layer
602 Metal layer
603 Metal layer
604 Solder pad
700 Triangular group
i1 Current path
i2 Current path

DETAILED DESCRIPTION

Our optoelectronic semiconductor chip may comprise a semiconductor body with a semiconductor layer sequence. The semiconductor layer sequence may comprise in particular an active region provided to generate and/or receive radiation. The active region is provided e.g. to receive or generate radiation in the ultraviolet, visible or infrared range of the spectrum. Moreover, the active region is arranged, for example, between a first semiconductor layer and a second semiconductor layer. It is expedient for the first semiconductor layer and the second semiconductor layer to be different from one another in terms of the conduction type. For example, the first semiconductor layer is n-type and the second semiconductor layer p-type or vice versa.

The semiconductor chip comprises a carrier, on which the semiconductor body is arranged. The first semiconductor layer connects to a first contact in an electrically-conductive manner. The first contact is formed on a rear side of the carrier facing away from the semiconductor body. The second semiconductor layer connects to both a second contact and a third contact in an electrically-conductive manner. The second contact is formed on the front side of the carrier facing towards the semiconductor body and the third contact is formed on the rear side of the carrier facing away from the semiconductor body. The second and third contacts are arranged opposite one another, for example.

The first contact, the second contact and the third contact are provided in particular for the external electrical connection of the optoelectronic semiconductor chip. To this end, these contacts each form freely accessible regions of an outer surface of the semiconductor chip. For example, at least one of the contacts is accessible for a wire-bond connection and/or at least one of the contacts is accessible for a soldered connection or an electrically-conductive adhesive connection.

The carrier may be an electrically conductive material, e.g. a semiconductor material. Alternatively or in addition, the carrier comprises a molding material. This molding material can contain e.g. epoxy resins or silicones and can be transparent or opaque to the radiation emitted or detected by the semiconductor chip. Moreover, the molding material can comprise further particles, e.g. reflective particles such as titanium dioxide particles. Alternatively or in addition, it is possible that the molding material comprises particles used to adjust the coefficient of thermal expansion of the carrier to the coefficient of thermal expansion of the other components of the semiconductor chip. Silicon dioxide particles, for example, are suitable for this purpose.

The first semiconductor layer may be arranged on the side of the active region facing away from the carrier. The first semiconductor layer additionally connects to the first contact via a first connection layer.

The semiconductor body may comprise at least one recess. The one or more recesses extend through the second semiconductor layer and through the active region. The first connection layer is at least partly arranged in the recess and connects to the first semiconductor layer.

The second semiconductor layer may connect to the second and third contacts in an electrically-conductive manner via a second connection layer.

The second connection layer may be arranged on the side of the active region facing towards the carrier.

An optoelectronic module may comprise at least one first semiconductor chip of the type presented above. The first contact thereof is in the form of a first rear contact. Similarly, the second contact of the one or more first semiconductor chips is in the form of a first front contact and the third contact thereof is in the form of a second rear contact.

Moreover, the optoelectronic module comprises at least one second semiconductor chip provided to generate or receive radiation. This second semiconductor chip further comprises at least one first front contact and at least one first rear contact. The first semiconductor chip and the second semiconductor chip mechanically connect by a module carrier. In addition, the first rear contacts of the first semiconductor chip and the second semiconductor chip and/or the first front contacts of the first semiconductor chip and the second semiconductor chip connect to one another in an electrically-conductive manner.

The optoelectronic module may comprise at least one third semiconductor chip provided to generate or receive radiation. The third semiconductor chip comprises a first front contact and a first rear contact. The first semiconductor chip, the second semiconductor chip and the third semiconductor chip mechanically connect by the module carrier and are arranged in the module carrier in a first row or in the form of a triangle in relation to one another. The first rear contacts of the first, second and third semiconductor chips connect to one another in an electrically-conductive manner and/or the first front contacts of the first, second and third semiconductor chips connect to one another in an electrically-conductive manner.

At least one further first, second and third semiconductor chip may be arranged in the module carrier in at least one second row or in the form of a further triangle in relation to one another. In addition, the first rear contacts of the first, second and third semiconductor chips each connect in an electrically-conductive manner along the rows or triangles. The respective first front contacts of the first semiconductor chips, second semiconductor chips and third semiconductor chips from different rows or different triangles form columns and connect to one another in an electrically-conductive manner. The respective first front contacts of the first semiconductor chips, second semiconductor chips and third semiconductor chips from different rows or different triangles connect to one another in an electrically-conductive manner.

The electrical connection on the rear sides of the semiconductor chips and/or on the front sides of the semiconductor chips may be made by thin metal layers, e.g. lithographically patterned metal connections. By solder pads, for example, the electrical connections can be externally connected and activated.

An electronic activation of the optoelectronic module may take place by the at least one second rear contact of one or more of the first semiconductor chips and by the rear contacts of one or more of the second and third semiconductor chips.

The rear contacts may be at least partly connected to bond pads or solder pads. The connection to the bond pads or solder pads is made e.g. via thin metal layers.

The at least one first semiconductor chip, the second semiconductor chip and the third semiconductor chip may be at least partly formed to generate or receive electromagnetic radiation of different wavelengths.

The module carrier may comprise an electrically-conductive material, a semiconducting material and/or a molding material. In particular, the module carrier comprises the carrier of the first semiconductor chip.

Moreover, the molding material of the module carrier can comprise further particles, e.g. reflective particles such as titanium dioxide particles. Alternatively or in addition, it is possible that the molding material comprises particles, the purpose of which is to adjust the coefficient of thermal expansion of the carrier to the coefficient of thermal expansion of the other components of the semiconductor chip. Silicon dioxide particles, for example, are suitable for this purpose.

The at least one second or the third semiconductor chip may comprise a further carrier and a semiconductor body having a semiconductor layer sequence arranged on the further carrier. The semiconductor layer sequence comprises an active region arranged between a first semiconductor layer and a second semiconductor layer and is provided to generate or receive radiation. The first semiconductor layer, in addition, connects to the first rear contact in an electrically-conductive manner. The first rear contact on a front side facing towards the semiconductor body is in the form of a further carrier. The first front contact is formed on a rear side of the carrier facing away from the semiconductor body. Finally, the first rear contact and the first front contact connect to one another in an electrically-conductive manner.

The first optoelectronic semiconductor chips are particularly suitable for a space-saving arrangement together with the second and third semiconductor chips to form functional units, e.g. an optoelectronic module. In this case, the electrical connection of the second and third contacts is such that an ohmic conductor is obtained. As a result, a front contact can connect through to the rear side so that no contact is necessary on the front side. This contacting through the carrier does not comprise a further p-n junction or diode.

The interconnection of the first optoelectronic semiconductor chips with other semiconductor chips can take place in a particularly space-saving manner, e.g. without any additional auxiliary chips or cut-outs in the molding material. If the semiconductor chips are arranged in the form of a matrix in rows or lines and columns, it is sufficient that at least one first semiconductor chip is provided in a corresponding row or column. The matrix interconnection along front or rear contacts along rows or columns allows individual activation of each of the semiconductor chips. By high-frequency repetition of the activation, a display or video screen with high resolution can thus be created.

Identical or similar elements or elements having the same effect are provided with the same reference numbers in the figures. The figures and the size ratios to one another of the elements illustrated in the figures should not be considered as being to scale. Rather, to illustrate them better and/or to make them easier to understand, the size of individual elements, and in particular layer thicknesses, may be exaggerated.

The description below is based, by way of example, on a semiconductor chip that generates radiation, e.g. a light-emitting diode semiconductor chip such as an LED. Deviating from this, the semiconductor chip can also be in the form of a radiation receiver, in which an active region generates an electrical signal as a function of the radiated power striking the active region.

An example of an optoelectronic semiconductor chip 1 is shown in FIG. 1A in a cross-sectional diagram.

The optoelectronic semiconductor chip 1 comprises a semiconductor body 2. The semiconductor body 2 comprises a semiconductor layer sequence having an active region 20. The active region 20 generates radiation in the ultraviolet, visible or infrared range of the spectrum. In a vertical direction, i.e. perpendicular to a main extension plane of the semiconductor layer sequence of the semiconductor body, the semiconductor body 2 extends between a radiation passage surface 26 and a main surface 27. The active region 20 is arranged between a first semiconductor layer 21 of a first conduction type and a second semiconductor layer 22 of a second conduction type which is different from the first conduction type. For example, the first semiconductor layer is n-type and the second semiconductor layer is p-type or vice versa. The semiconductor body, in particular the active region, preferably contains a III-V compound semiconductor material.

III-V compound semiconductor materials are particularly suitable for generating radiation in the ultraviolet ($Al_xIn_yGa_{1-x-y}N$) through the visible ($Al_xIn_yGa_{1-x-y}N$, in particular for blue to green radiation, or $Al_xIn_yGa_{1-x-y}P$, in particular for yellow to red radiation) to the infrared ($Al_xIn_yGa_{1-x-y}As$) range of the spectrum. The following applies: $0 \leq x \leq 1$, $0 \leq y \leq 1$ and $x+y \leq 1$, in particular with $x \neq 1$, $y \neq 1$, $x \neq 0$ and/or $y \neq 0$. With III-V compound semiconductor materials, in particular from the aforementioned material systems, furthermore, high internal quantum efficiencies can be achieved in generating radiation.

The semiconductor chip 1 furthermore comprises a carrier 5 extending in a vertical direction between a front side 51 and a rear side 52. The carrier in this example contains a molding material, e.g. composed of epoxy resin or silicones. The molding material can be either transparent or opaque to light emitted or detected in the wavelength range used in the semiconductor chip 1. The semiconductor body 2 connects to the carrier 5 by the molding material in a mechanically stable manner.

The molding material can further comprise fillers, for instance particles, e.g. reflective particles such as titanium dioxide particles. Furthermore, it is possible that the molding material comprises particles, the purpose of which is to adjust the coefficient of thermal expansion of the carrier 5 to the coefficient of thermal expansion of the other components of the semiconductor chip. Silicon dioxide particles, for example, are suitable for this purpose.

The semiconductor body 2 comprises a plurality of recesses 25 extending from the main surface 27 through the second semiconductor layer 22 and the active region 20 into the first semiconductor layer 21 and end there. To make the illustration clearer, only two recesses 25 are shown in the drawing. The recesses 25 each connect to a first connection layer 31 in an electrically-conductive manner, which extends within the carrier 5. By the connection layer 31, the recesses 25 connect to one another in an electrically-conductive manner.

The connection layer 31 additionally extends in a vertical direction through the carrier 5 to the rear side 52 of the carrier 5 and ends there. At this point, a first contact 41 is formed. The first contact 41 connects e.g. by a thin metallic layer to a solder pad for electrical contacting of the semiconductor chip 1 by a wire-bond connection.

The optoelectronic semiconductor chip 1 furthermore comprises a second connection layer 32 connected to the second semiconductor layer 22 in an electrically-conductive manner. The connection layer 32 extends at least partly in a horizontal direction along the main surface 27 of the carrier 5 to the rear side 52 of the carrier 5. The connection layer 32 is configured such that it extends so far that a second contact 42 is formed at one end. The second contact 42 is connected e.g. by a thin metal layer, e.g. a lithographically patterned metal layer, for the electrical contacting of the semiconductor chip 1 by a wire-bond connection.

In a vertical direction, the connection layer 32 extends through the carrier 5 to the rear side 52 of the carrier 5 and ends there. At this point, a third contact 43 is formed. The third contact 43, like the first contact 41, connects e.g. by a thin metal layer to a solder pad for electrical contacting of the semiconductor chip 1 by a wire-bond connection.

Figure 1B:
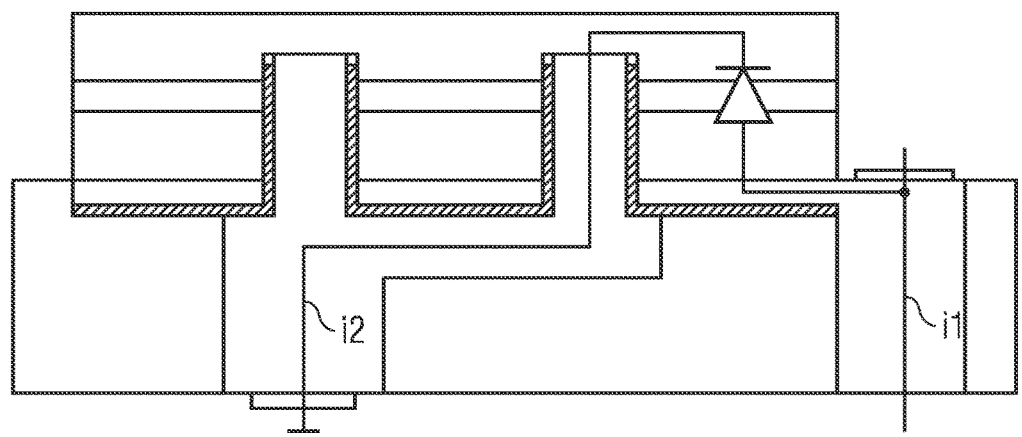

The second contact 42 and the third contact 43 connect to one another in an electrically-conductive manner by the second connection layer 32 through a first current path it (cf. FIG. 1B) extending from the front side 51 to the rear side 52. The first current path it is, in a sense, an ohmic current path that runs through the carrier 5 and not through a p-n junction or through the diode itself. In FIG. 1B, an equivalent circuit diagram of the current paths in the semiconductor chip 1 is drawn in.

The first, second and third contacts 41, 42, 43 do not necessarily have to be layers provided in addition to the first or second connection layer 31, 32. Alternatively, a region of the first or second connection layer 31, 32 which is freely accessible for external electrical contacting can itself also form the contacts 41, 42, 43.

The second connection layer 32 and the first connection layer 31 overlap at least in some regions in a top view of the semiconductor chip 1. Between the first connection layer 31 and the second connection layer 32 and partly along the carrier 5, an insulation layer 9 is formed. The insulation layer 9 also covers the side surfaces of the recesses 25 and thus insulates the first connection layer 31 from the second semiconductor layer 22 and from the active region 20. In other words, the first contact 41 and the second contact 42 connect to one another in an electrically-conductive manner only via the diode or by a second current path i2 (cf. FIG. 1B).

The first contact 41 and the third contact 43 are arranged on the rear side 52 of the carrier 5, thus allowing a rear-side contacting of the semiconductor chip 1. The second contact 42 is arranged at the side of the semiconductor body 2 so that shading of the radiation passage surface 26 by a radiopaque contact material can be avoided. The semiconductor chip 1 can connect in an electrically-conductive manner at the front side by the second contact 42.

During operation of the optoelectronic semiconductor chip 1, an external electrical voltage can be applied between the first contact 41 and the second contact 42 or the third contact 43 so that charge carriers are injected into the active region 20 and recombine there, emitting radiation. This is indicated by an equivalent circuit diagram in FIG. 1B by the second current path i2.

Since the semiconductor chip 1 has two contacts (e.g. n- and p-contacts) on the rear side 52 with the first and third contacts 41, 43 and an additional contact on the front side 51 with the second contact 42, the semiconductor chip 1 can advantageously be combined with other semiconductor chips to form functional units. On condition that the polarity of the semiconductor chips is identical, with a functional unit composed of multiple optoelectronic semiconductor chips having different color characteristics (for instance an RGB unit), for example, one optoelectronic semiconductor chip 1 of the proposed type, with the front- and rear contacts shown, is sufficient to be able to dispense with additional connections, e.g. using additional auxiliary chips or cut-outs in the molding material. Details of the interconnection to form larger functional units or optoelectronic modules will be discussed in detail below. The individual semiconductor chips can interconnect in rows and columns or in the form of a matrix and can operate individually with a high repetition rate.

Via the plurality of recesses 25, charge carriers can be injected uniformly in a lateral direction into the first semiconductor layer 21. In particular, depending on the transverse conductivity of the first semiconductor layer 21, the number of recesses 25 can be varied within broad limits. In an extreme case, just one individual recess 25 can be sufficient for the electrical contacting of the first semiconductor layer 21.

The optoelectronic semiconductor chip 1 is in the form of e.g. a thin-film semiconductor chip, in which a growth substrate for the semiconductor layer sequence of the semiconductor body 2 is removed after its epitaxial deposition. A semiconductor chip of this type represents, as a good approximation, a Lambertian surface emitter. Deviating from this, however, the growth substrate can also remain in the semiconductor chip completely or can be removed or thinned in some regions only.

On the radiation passage surface 26 of the semiconductor body 2, a radiation conversion element (not shown) can be arranged. For example, by the radiation conversion element, radiation in the blue range of the spectrum generated in the active region 20 of the semiconductor body can be converted at least partly to radiation in the yellow range of the spectrum so that the semiconductor chip 1 overall can emit mixed radiation appearing white to the human eye. A suitable radiation conversion element is e.g. a prefabricated plate with a rectangular basic shape, which is attached to the semiconductor body 2. Alternatively, the radiation conversion element can completely cover the semiconductor chip. Depending on the wavelength to be emitted, it is also possible to dispense with the radiation conversion element.

Figure 1C:
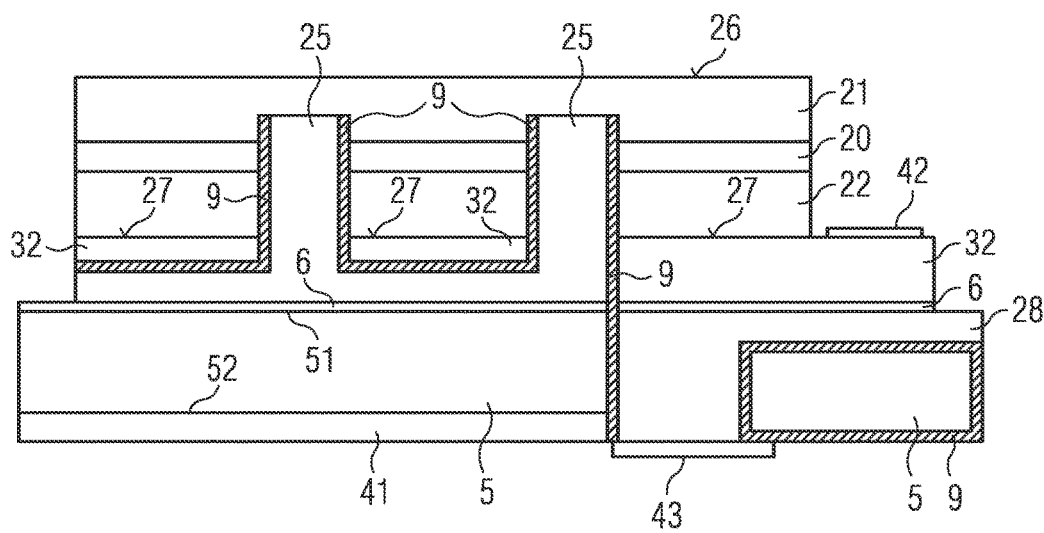
Figure 1D:
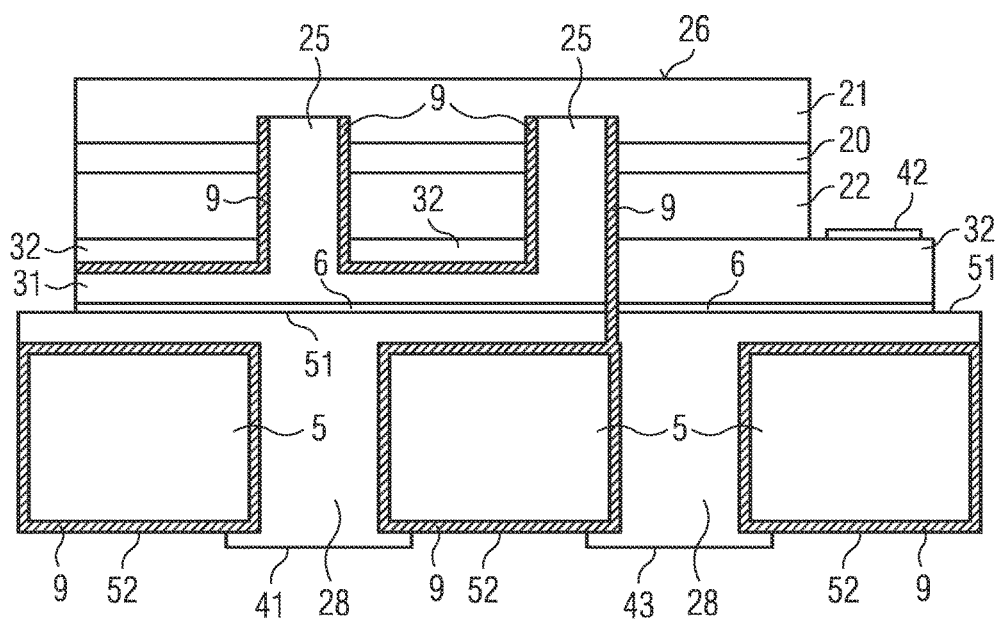

The examples in FIGS. 1C and 1D represent alternative versions of the semiconductor chip 1. Only the differences will be discussed below. Operation of the optoelectronic semiconductor chips 1 is similar to that presented in association with FIGS. 1A and 1B. In particular, all examples have a second and third contact connected to one another in an electrically-conductive manner by the second connection layer 32 through a current path extending from the front side 51 to the rear side 52. The current path is likewise an ohmic current path in the sense presented above running through the carrier 5 and not running through a p-n junction or through the diode itself.

A further example of an optoelectronic semiconductor chip 1 is shown in a cross-sectional diagram in FIG. 1C.

In this example, the carrier 5 contains e.g. a doped semiconductor material such as silicon or germanium. The semiconductor body 2 connects to the carrier 5 in a mechanically stable manner by a joining layer 6, e.g. an electrically-conductive adhesive layer or a solder layer.

In addition, the first connection layer 31 covers the entire surface of the carrier 5 in the region of the recesses 25. In a lateral direction, the first connection layer 31 is delimited by an insulation layer 9 of at least one recess 25, which insulation layer extends in a vertical direction through the carrier 5. The first semiconductor layer 21 connects to a first contact 41 in an electrically-conductive manner. The first contact 41 is formed on the rear side 52 of the carrier 5.

The second connection layer 32 extends substantially as described in FIG. 1A and is provided with a second contact 42. In a vertical direction, the second connection layer 32 can connect in an electrically-conductive manner by the joining layer 6 to a further connection layer extending into the carrier 5 into a further recess 28 and ends in the region of the rear side 52 thereof. Alternatively, the second connection layer 32 can extend continuously to the rear side of the carrier 5. In both cases, the connection layers 32 are separated electrically from the first connection layer 31 by the insulation layer 9 of the recess 25. The third contact 43 is formed on the connection layer on the rear side 52 of the carrier. Furthermore, the connection layer 32 is insulated from the carrier 5 by the insulation layer 9.

A further example of an optoelectronic semiconductor chip 1 is shown in a cross-sectional diagram in FIG. 1D.

This example is based on the one from FIG. 1C. Deviating therefrom, the carrier 5 is structured to form further recesses 28 encompassing the first connection layer 31 and at the end of which the first contact is formed in the region of the rear side 52 of the carrier 5.

FIGS. 2A, 2B, 2C and 2D show an example of an optoelectronic module in a 3×3 matrix arrangement. FIG. 2A shows a front view and FIG. 2B a rear view of the optoelectronic module. FIGS. 2C and 2D each show the arrangement of semiconductor chips in a module carrier and their interconnection with one another.

In FIG. 2A, the 3×3 matrix arrangement of multiple optoelectronic semiconductor chips 200, 300, 400 is shown. A first type 200 of the semiconductor chips is an optoelectronic semiconductor chip of a type described in FIGS. 1A to 1D. These semiconductor chips 200 are configured to emit blue light in this example. The first, second and third contacts are referred to in this context by the reference numbers 241, 242 and 243. A second type 300 of the semiconductor chips is an optoelectronic semiconductor chip with a first contact 341 on its rear side and a second contact 342 on its front side. A third type 400 of the semiconductor chips is an optoelectronic semiconductor chip with a first contact 441 on its rear side and a second contact 442 on its front side. The second type 300 of the semiconductor chips is configured to emit green light by way of example and the third type 400 of the semiconductor chips is configured to emit red light by way of example.

The semiconductor chips 200, 300, 400 are arranged along a 3×3 matrix. The electrical contacting of the semiconductor chips 200, 300, 400 takes place via the front contacts 242, 342, 442 and by respective thin metal layers 601. In each case, in a row 101, 102, 103 or a column 104, 105, 106 of the matrix arrangement, a semiconductor chip of the first type 200, of the second type 300 and of the third type 400 are interconnected. Since the semiconductor chips 200, 300, 400 have different color characteristics in their emission of light, it is possible in a sense to talk of a contacting between the colors (cf. FIG. 2C).

In FIG. 2B, the rear side of the 3×3 matrix arrangement of multiple optoelectronic semiconductor chips 200, 300, 400 is shown. The electrical contacting of the semiconductor chips 300, 400 takes place via the rear contacts 341, 441 and by respective thin metal layers 600. In each case, the semiconductor chips of the second type 300 and those of the third type 400 are interconnected in a column 104, 105 of the matrix arrangement.

The special configuration of the semiconductor chips of the first type 200 permits a special interconnection. On their rear side, the semiconductor chips of the first type 200 have two contacts corresponding to the first and second contacts 41, 43 from FIGS. 1A to 1D. In the context of the illustration of the module 100, these contacts are referred to by the reference numbers 241 and 243, respectively. The first contacts 241 each electrically bond to one another by thin metal layers 602 and interconnect with one another in this way. The third contacts 243 can be bonded by thin metal layers 603 and solder pads 604 and can be used for activation. The semiconductor chips of the first type 200 are arranged and interconnect along a column 106. In this way, overall a contacting of the semiconductor chips 200, 300, 400 takes place along the colors in the sense outlined above (cf. FIG. 2D).

The arrangement in a matrix and the above-mentioned contacting along the colors by the rear contacts and between the colors by the front contacts leads to a matrix interconnection of a functional unit composed of the semiconductor chips 200, 300, 400, e.g. an RGB unit for a display or a video screen. The third contacts 243 allow the functional unit or 3×3 matrix arrangement to connect to suitable control means. In this way, the respective semiconductor chips can be activated individually in rows or columns according to the matrix. Moreover, with the rear-side configuration of the third contacts, a particularly space-saving arrangement of the semiconductor chips is possible since these do not each have to have a further activating contact or further wire-bond connections on the front side. In particular, it is possible to dispense with additional auxiliary chips or cut-outs in the carrier.

In different configurations of the example of FIGS. 2A and 2B presented above, the contacts can be e.g. n- or p-contacts. In addition, orientation of the semiconductor chips to one another can vary. In FIGS. 2A and 2B, the semiconductor chips are represented by square areas. The semiconductor chips can have a square basic shape, e.g. through square semiconductor bodies. However, the principle presented above is not limited to this shape.

FIGS. 2C and 2D show side views of the arrangement of semiconductor chips in a module carrier. The module carrier 150 comprises a molding material and the semiconductor chips 200, 300, 400 are embedded in the molding material of the carrier 150. The molding material allows a particularly mechanically stable arrangement. The module carrier 150 is at least partly embedded in the carrier 5 of the semiconductor chips.

FIG. 2C illustrates the contacting between the colors along the rows 101, 102, 103. In particular, the third contact 243 can be led out laterally on a rear side of the module and does not cover the front side of the first semiconductor chip 200. FIG. 2D illustrates the contacting within the colors, e.g. along the columns 104, 105, 106.

FIGS. 3A, 3B, 3C and 3D show an example of an optoelectronic module in a 3×6 matrix arrangement. FIG.

Figure 3A:
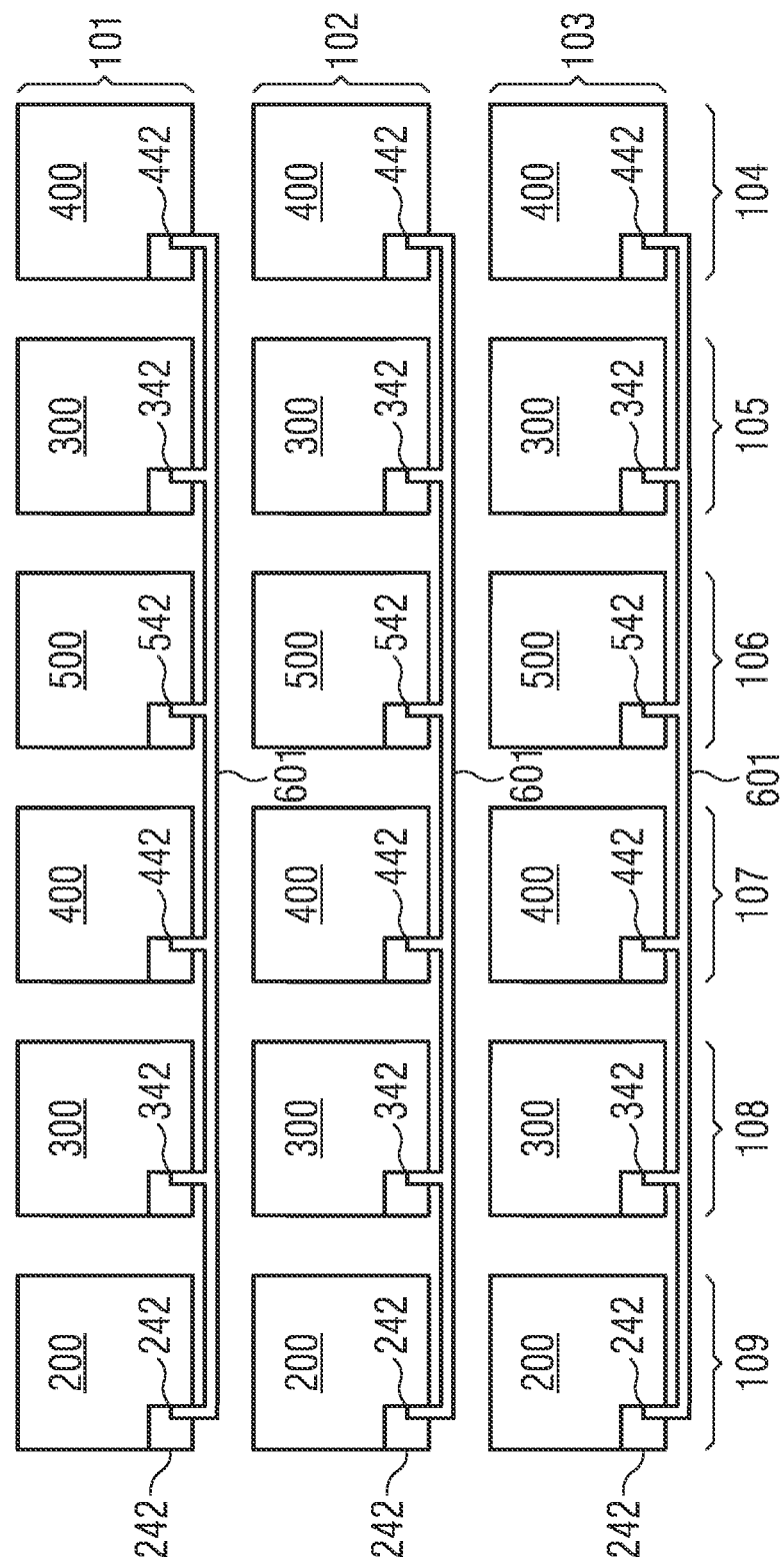
Figure 3C:
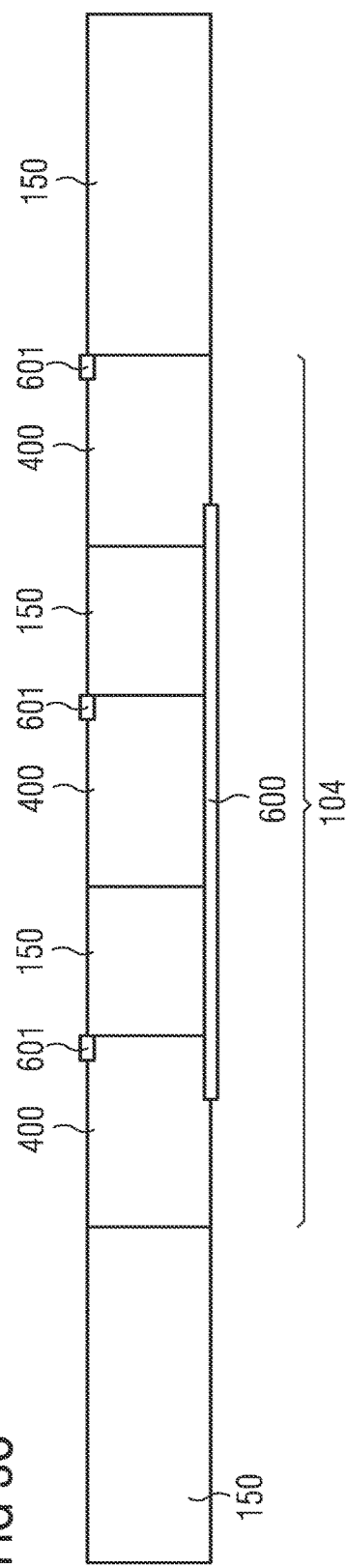
Figure 3D:
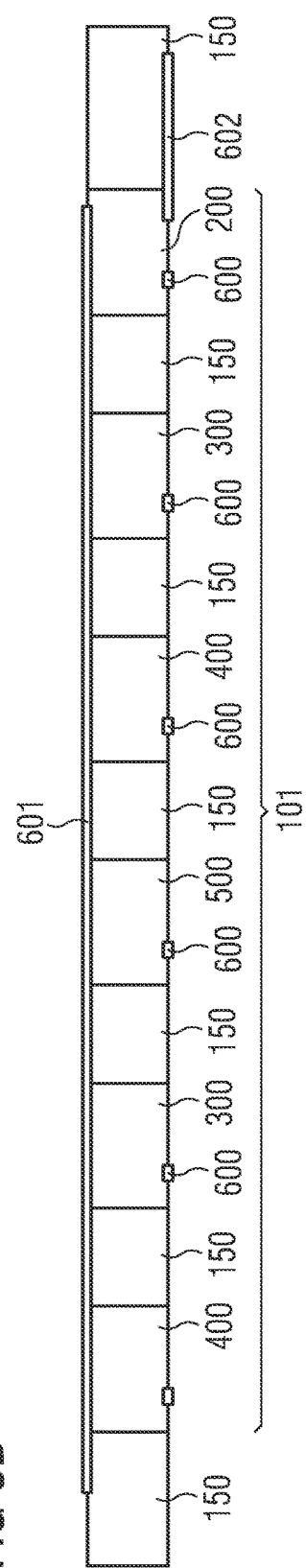

3A shows a front view and FIG. 3B a rear view of the optoelectronic module. FIGS. 3C and 3D each show the arrangement of semiconductor chips in the module carrier and their interconnection with one another.

The 3×6 matrix arrangement based on the 3×3 matrix arrangement from FIGS. 2A to 2D represents, in a sense, an extension. In addition, a column 106 is provided, which comprises a fourth type 500 of the semiconductor chips with a first contact 541 on its rear side and a second contact 542 on its front side. The fourth type 500 of the semiconductor chips is configured to emit blue light by way of example.

The semiconductor chips 200, 300, 400, 500 are arranged according to the 3×6 matrix arrangement in rows 101, 102, 103 and columns 104, 105, 106, 107, 108, 109, thus forming the optoelectronic module. The semiconductor chips of the first type 200, i.e. the semiconductor chips with two rear contacts 241, 243, are each located at the end of a row. This circumstance allows a space-saving interconnection.

Figure 4A:
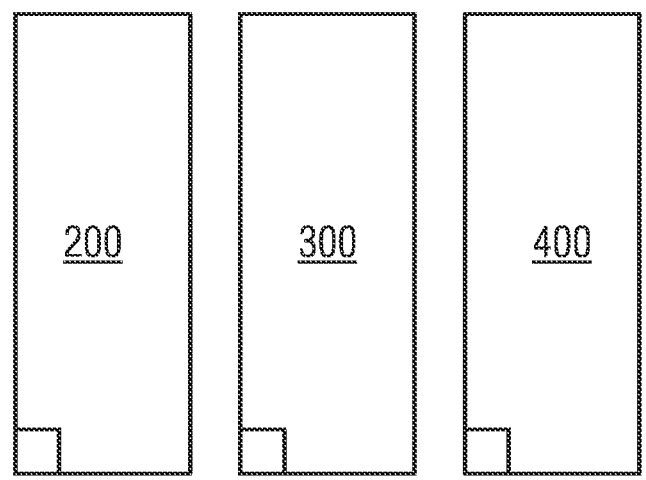
FIGS. 4A, 4B, and 4C show further examples of an optoelectronic module.
Figure 4B:
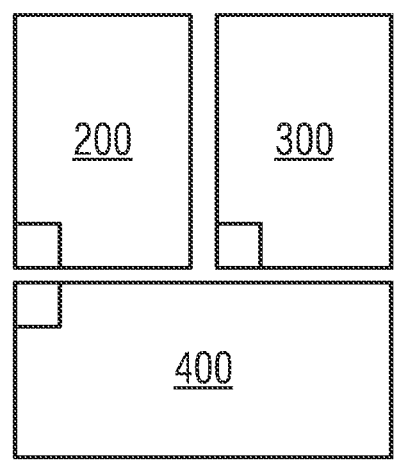
Figure 4C:
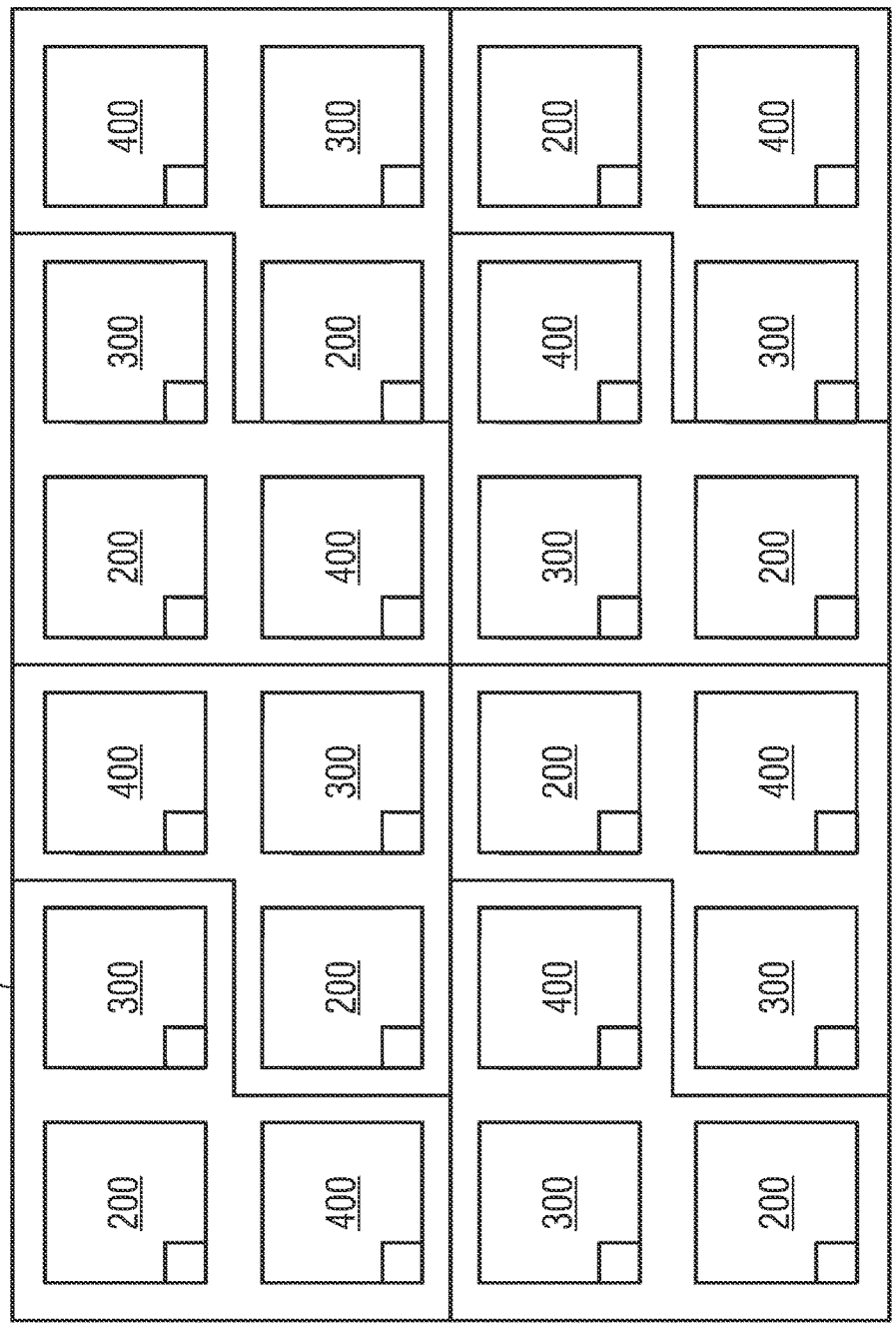

FIGS. 4A, 4B and 4C show further examples of an optoelectronic module.

FIG. 4A shows a row of semiconductor chips 200, 300, 400, each represented by a rectangular area. Moreover, FIG. 4B shows a triangular arrangement of semiconductor chips 200, 300, 400, which likewise have a rectangular base, but which can each be characterized by various side lengths. The semiconductor chips can have various basic shapes, manifested e.g. as square or rectangular semiconductor bodies.

FIG. 4C shows a 3×6 matrix arrangement of triangular groups 700. Each triangular group 700 comprises a first, second and third semiconductor chip 200, 300, 400. The electrical connection is formed as in a row along the colors in the sense of FIGS. 2A and 3A. Only the spatial arrangement is different so that the metal layers accordingly run at an angle on the front or rear side. The first semiconductor chips of each triangular group 700 are arranged at an edge of the 3×6 matrix arrangement. Deviating from the arrangements according to FIGS. 2A and 3A, for example, the first semiconductor chips have different emission characteristics and each emit e.g. in the blue, red or green range of the spectrum.

FIGS. 5A, 5B, 5C and 5D show examples of a rear-side interconnection of an optoelectronic module.

The rear contacts of the semiconductor chips interconnect with one another by the thin metal layers and can be externally bonded by solder pads 604, thus enabling activation of the optoelectronic module. For example, the individual semiconductor chips of RGB units interconnect in rows and columns or in the form of a matrix and operate individually with a high repetition rate.

Figure 5A:
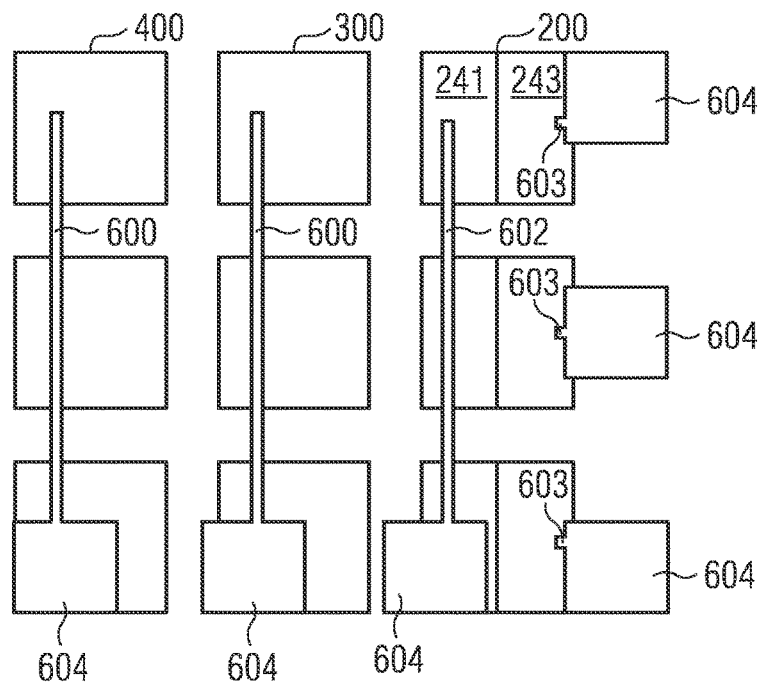
Figure 5B:
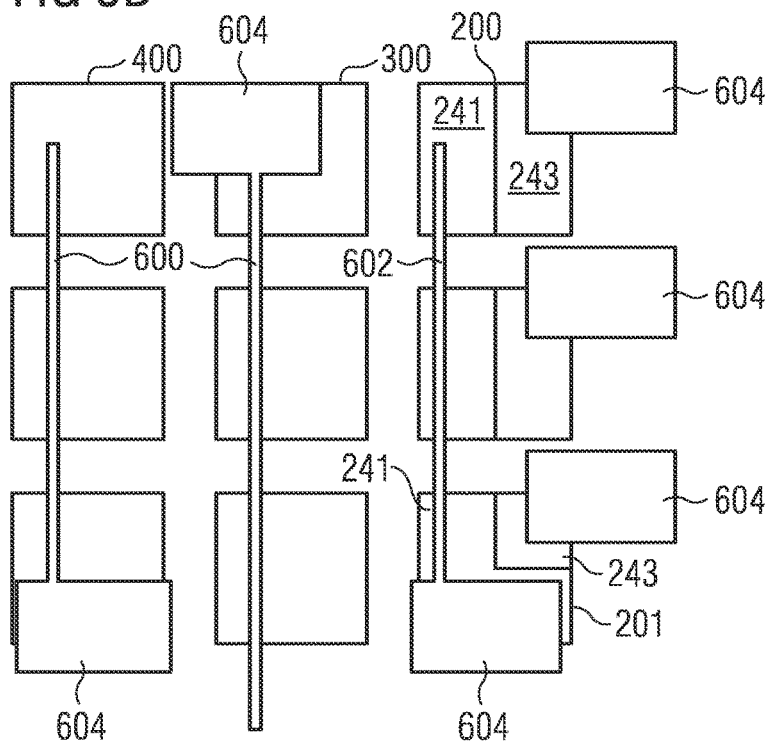

The solder pads 604 can completely or partly overlap the bases of the semiconductor chips, as indicated e.g. in FIG. 5A, 5B or 5D. It is also possible to arrange the solder pads 604 at least partly next to the actual semiconductor chips, as shown in FIG. 5C.

The solder pads 604 are each provided at edges of the arrangements of semiconductor chips. In this way, the individual rows and columns and thus individual semiconductor chips can be addressed via the rear side of the module. On the front side, the contacts can connect with the aid of thin metal layers in an electrically-conductive manner.

FIGS. 5A and 5C each show a 3×3 matrix arrangement as was presented in FIGS. 2A to 2D. The solder pads 604 are each arranged at edges, overlapping the semiconductor chips in FIG. 5A and next to the semiconductor chips in FIG. 5C.

The arrangement of FIG. 5B differs somewhat from this arrangement. The solder pads 604 are arranged overlapping the semiconductor chips, but at different edges in some cases. This enables design specifications to be implemented flexibly. In addition, semiconductor chips can be installed with different contact geometries. A semiconductor 201 of the first type 200 is inserted in the lower right-hand corner of the arrangement. Its contacts 241 and 243 are designed to be able to fill the corner of the arrangement in a space-saving manner.

The arrangement of FIG. 5D differs from the arrangements of FIGS. 5A and 5C. In this arrangement, a semiconductor chip 200 having emission characteristics that differ from those of the first semiconductor chips of the other semiconductor chips 200 in the other rows is inserted in the middle row.

This application claims priority of DE 10 2015 107 526.1, the subject matter of which is incorporated herein by reference.

The description with the aid of the examples does not limit this disclosure thereto. Rather, this disclosure comprises any new feature and any combination of features, which in particular includes any combination of features in the appended claims, even if the feature or combination is not itself explicitly stated in the claims or examples.

The invention claimed is:

1. An optoelectronic semiconductor chip comprising a carrier and a semiconductor body arranged on the carrier with a semiconductor layer sequence, wherein
   the semiconductor layer sequence comprises an active region arranged between a first semiconductor layer and a second semiconductor layer and generates or receives electromagnetic radiation,
   the first semiconductor layer connects to a first contact in an electrically-conductive manner,
   the first contact is formed on a rear side of the carrier facing away from the semiconductor body,
   the second semiconductor layer connects to both a second contact and a third contact in an electrically-conductive manner, and
   the second contact is formed on the front side of the carrier facing towards the semiconductor body and the third contact on the rear side of the carrier facing away from the semiconductor body.

2. The optoelectronic semiconductor chip according to claim 1, wherein the carrier comprises an electrically-conductive material, a semiconducting material and/or a molding material.

3. The optoelectronic semiconductor chip according to claim 1, wherein the first semiconductor layer is arranged on the side of the active region facing away from the carrier and the first semiconductor layer connects to the first contact via a first connection layer.

4. The optoelectronic semiconductor chip according to claim 1, wherein the semiconductor body comprises at least one recess extending through the second semiconductor layer and through the active region, and the first connection layer is arranged at least partly in the recess and connects to the first semiconductor layer.

5. The optoelectronic semiconductor chip according to claim 1, wherein the second semiconductor layer connects to the second and third contacts in an electrically-conductive manner via a second connection layer.

6. The optoelectronic semiconductor chip according to claim 5, wherein the second connection layer is arranged on the side of the active region facing towards the carrier.

7. An optoelectronic module comprising:
   at least one first semiconductor chip according claim 1, wherein the first contact thereof forms a first rear contact, the second contact thereof forms a first front contact and the third contact thereof forms a second rear contact, at least one second semiconductor chip that generates or receives radiation and comprises at least one first front contact and at least one first rear contact, wherein the first semiconductor chip and the second semiconductor chip mechanically connect by a module carrier, and the first rear contacts of the first semiconductor chip and of the second semiconductor chip and/or the first front contacts of the first semiconductor chip and of the second semiconductor chips connect to one another in an electrically-conductive manner.

8. The optoelectronic module according to claim 7, having at least one third semiconductor chip that generates or receives radiation and comprises at least one first front contact and at least one first rear contact, the first semiconductor chip, the second semiconductor chip and the third semiconductor chip mechanically connect by the module carrier and are arranged in the module carrier in a first row or in the form of a triangle in relation to one another, and wherein the first rear contacts of the first semiconductor chip, the second semiconductor chip and the third semiconductor chip and/or the first front contacts of the first semiconductor chip, the second semiconductor chip and the third semiconductor chip connect in an electrically-conductive manner.

9. The optoelectronic module according to claim 7, wherein at least one further first, second and third semiconductor chip are each arranged in the module carrier in at least one second row or in the form of a further triangle in relation to one another, and each of the first rear contacts of the first semiconductor chips, the second semiconductor chips and the third semiconductor chips connect in an electrically-conductive manner along the rows or triangles, and each of the first front contacts of the first semiconductor chips, the second semiconductor chips and the third semiconductor chips from different rows or different triangles connect in an electrically-conductive manner.

10. The optoelectronic module according to claim 7, wherein an electrical connection of the semiconductor chips is made by lithographically patterned metal layers.

11. The optoelectronic module according to claim 7, wherein an electronic activation of the module takes place by the at least one second rear contact of one or more of the first semiconductor chips and by the rear contacts of one or more of the second and third semiconductor chips.

12. The optoelectronic module according to claim 7, wherein the rear contacts at least partly connect to solder pads.

13. The optoelectronic module according to claim 7, wherein the at least one first semiconductor chip, second semiconductor chip and third semiconductor chip are, at least in some cases, formed to generate or receive electromagnetic radiation of different wavelengths.

14. The optoelectronic module according to claim 7, wherein the module carrier comprises an electrically-conductive material, a semiconducting material and/or a molding material, and at least partly embeds the carrier of the first semiconductor chip.

15. The optoelectronic module according to claim 7, wherein the at least one second or third semiconductor chip comprises a further carrier and a semiconductor body with a semiconductor layer sequence arranged on the further carrier, wherein the semiconductor layer sequence comprises an active region arranged between a first semiconductor layer and a second semiconductor layer and generates or receives radiation, the first semiconductor layer connects to the first rear contact in an electrically-conductive manner, the first rear contact is formed on a front side of the further carrier facing towards the semiconductor body, the first front contact is formed on a rear side of the further carrier facing away from the semiconductor body, and the first rear contact and the first front contact connect to one another in an electrically-conductive manner.

16. An optoelectronic module comprising:

at least one first semiconductor chip comprising a carrier and a semiconductor body arranged on the carrier, wherein the semiconductor layer sequence comprises an active region arranged between a first semiconductor layer and a second semiconductor layer and generates or receives electromagnetic radiation, wherein the first semiconductor layer connects to a first contact in an electrically-conductive manner, the first contact being formed on a rear side of the carrier facing away from the semiconductor body, wherein the second semiconductor layer connects to both a second contact and a third contact in an electrically-conductive manner, the second contact being formed on the front side of the carrier facing towards the semiconductor body and the third contact on the rear side of the carrier facing away from the semiconductor body, and at least one second semiconductor chip that generates or receives radiation and comprises at least one first front contact and at least one first rear contact, wherein the first semiconductor chip and the second semiconductor chip mechanically connect by a module carrier, the first front contacts of the first semiconductor chip and of the second semiconductor chip connect to one another in an electrically-conductive manner, and an electrical activation of the optoelectronic module takes place by a second rear contact of the at least one first semiconductor chip.

* * * * *